United States Patent [19]
Wang et al.

[11] Patent Number: 5,792,705
[45] Date of Patent: Aug. 11, 1998

[54] OPTIMIZED PLANARIZATION PROCESS FOR SOG FILLED VIAS

[75] Inventors: Chin-Kun Wang, Taipei; Yuan-Chang Huang, Hsin-Chu; Iman Hsu, Miao-Li, all of Taiwan

[73] Assignee: Taiwan Semiconductor Manufacturing Company, Ltd., Hsin-Chu, Taiwan

[21] Appl. No.: 921,882

[22] Filed: Sep. 2, 1997

Related U.S. Application Data

[63] Continuation of Ser. No. 496,014, Jun. 28, 1996, abandoned.

[51] Int. Cl.$^6$ .................................................. H01L 21/4763
[52] U.S. Cl. ........................ 438/624; 438/626; 438/631; 438/699; 438/723; 438/903; 438/763
[58] Field of Search ............................... 437/195, 228, 437/231, 235, 246, 238; 134/1, 1.2; 438/624, 626, 631, 697, 699, 723, 738, 906, 763

[56] References Cited

U.S. PATENT DOCUMENTS

| | | | |
|---|---|---|---|
| 4,634,496 | 1/1987 | Mase et al. | 156/643 |
| 4,946,550 | 8/1990 | Van Laarhoven | 156/643 |
| 4,983,543 | 1/1991 | Sato et al. | 437/194 |
| 5,316,980 | 5/1994 | Takeshiro | 437/228 |
| 5,352,630 | 10/1994 | Kim et al. | 437/195 |
| 5,362,668 | 11/1994 | Tasaka | 437/67 |
| 5,413,670 | 5/1995 | Langan et al. | 134/1.2 |
| 5,461,010 | 10/1995 | Chen et al. | 438/697 |
| 5,549,786 | 8/1996 | Jones et al. | 438/437 |
| 5,567,658 | 10/1996 | Wang et al. | 437/228 |
| 5,622,595 | 4/1997 | Gupta et al. | 437/710 |
| 5,679,606 | 10/1997 | Wang et al. | 438/763 |
| 5,723,380 | 3/1998 | Wang et al. | 438/624 |
| 5,733,797 | 3/1998 | Yamaha | 438/624 |

*Primary Examiner*—Olik Chaudhuri
*Assistant Examiner*—Lynne A. Gurley
*Attorney, Agent, or Firm*—George O. Saile; Stephen B. Ackerman

[57] ABSTRACT

A planarization process, featuring removal of spin on glass, used to fill narrow spaces between metal lines, has been developed. A dual dielectric, of underlying silicon oxide, and overlying silicon nitride, are initially used to passivate the metal lines, followed by the spin on glass fill. A RIE etchback of the spin on glass proceeds to a point in which the silicon nitride, on the metal line, is exposed. The exposed silicon nitride is then removed leaving a silicon oxide passivated metal line, and seamless insulator filled spaces. The ability of not exposing the passivating silicon oxide to RIE echback process, allows seamless fills to result.

20 Claims, 4 Drawing Sheets

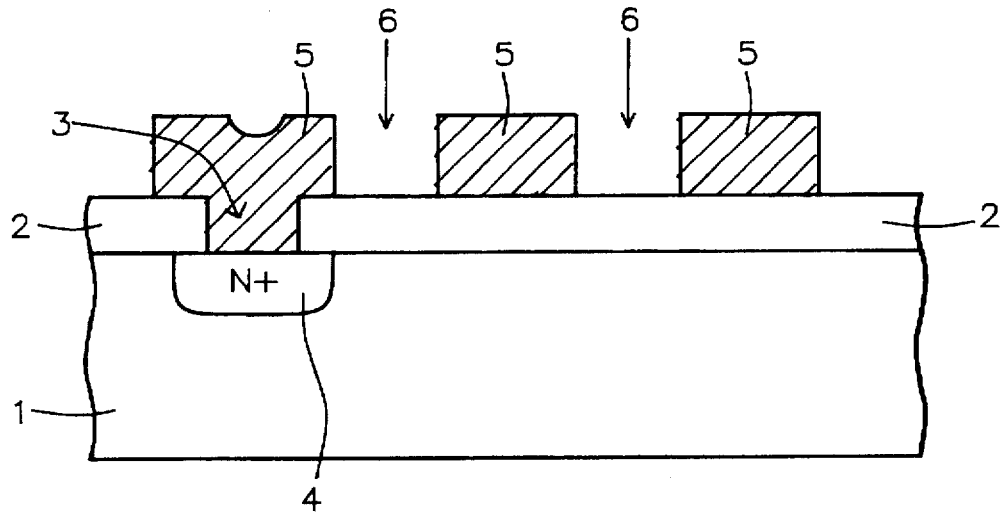
FIG. 1
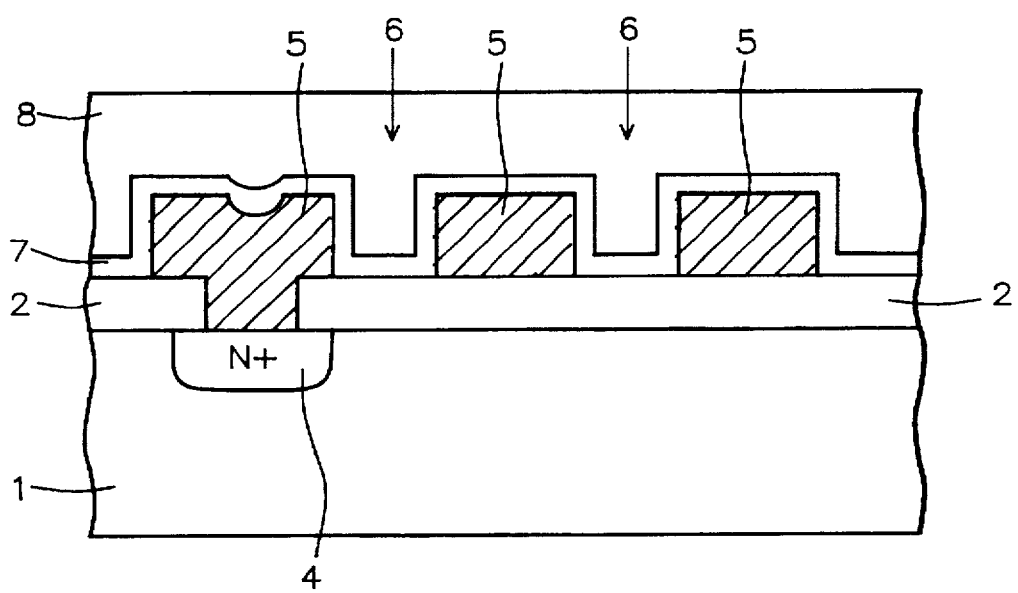
FIG. 2 - Prior Art

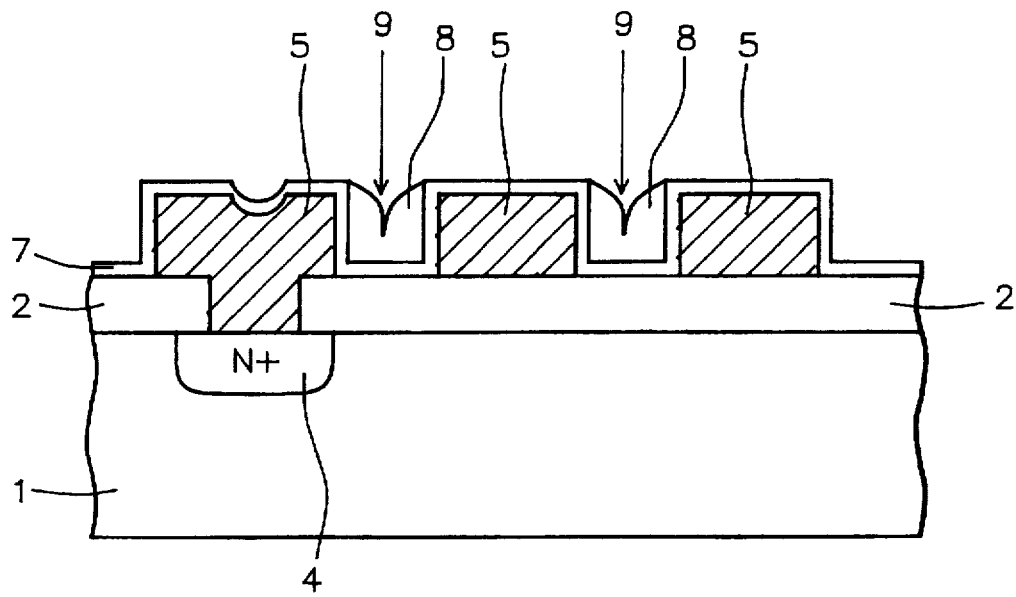
*FIG. 3 - Prior Art*
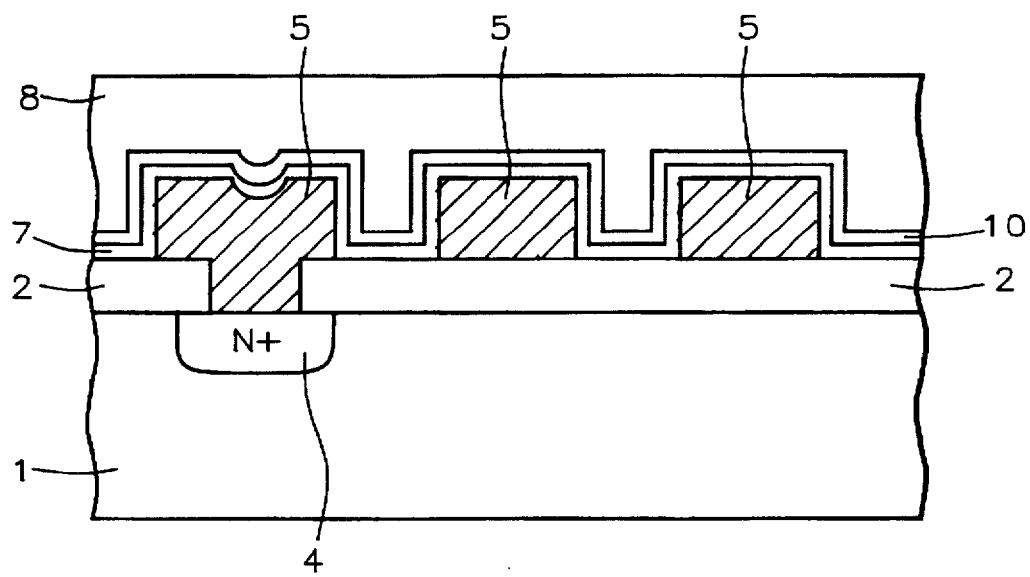
*FIG. 4*

1

OPTIMIZED PLANARIZATION PROCESS FOR SOG FILLED VIAS

This is a continuation of application Ser. No. 08/496,014, filed Jun. 28, 1995, now abandoned.

BACKGROUND OF THE INVENTION

1. Field of the Invention

The present invention relates to a method of making a semiconductor device, and more specifically to a process used for forming a planarized insulator layer, obtained from a composite dielectric that includes an organic spin-on-glass, (SOG), film

2. Description of Prior Art

The major objective of the semiconductor industry is to produce higher performing silicon devices, at reduced costs. The goal of cost reduction has been realized by the ability of the industry to continually reduce silicon chip size, thus resulting in more chips per silicon wafer, ultimately lowering the cost of specific chips. The reduction in chip size is realized by the trend to micro-miniaturation of specific critical chip features, allowing for greater packing densities. Major advances in many semiconductor processes, have led the way to micro-miniaturazation. For example more sophisticated exposure cameras, as well as the development of more sensitive photoresist materials have resulted in sub-micron images in photoresist to be routinely realized. Similar advances in the dry etching discipline have been used to transfer sub-micron images in photoresist to underlying semiconductor materials, used for the fabrication of advanced silicon devices. In addition similar developments in the chemical vapor deposition, and ion implantation sectors, have also been major contributers to the realization of smaller chips.

Another benefit of micro-miniaturazation, in addition to reducing costs, has been the increased performance realized via the use of smaller devices. For example smaller poly-silicon gate structures result in smaller channel lengths, thus improving the performance of metal oxide semiconductor field effect transistors, (MOSFET). Another example is reduced wire lines and spaces resulting in less resistance then previously used counterparts, fabricated with longer lines and spaces. However the reduction in metal wire lines and spaces has made the insulation process, used to isolate narrow lines and spaces, more difficult. The trend to narrower lines create the need to increase the thickness of the wire to maintain conductivity, and together with narrower spaces between lines, result in a high aspect ratio space, more difficult to fill with insulation, then counterparts previously observed with wider lines and spaces. The industry has attempted to solve the filling problem by using a combination of plasma enhanced chemical vapor deposition, (PECVD), underlays, and an organic spin-on-glass, (SOG). The thin PECVD oxide provides the passivating aspect for the metal line, while the SOG procedure fills the narrow, high aspect ratio spaces between metal lines. This planar structure is next subjected to an etchback process, used to remove SOG from all area except between metal lines. This would be followed by an additional dielectric deposition on the planarized, underlying, metal wire—SOG filled space, structure. Subsequent vias to the underlying metal wire can then be fabricated in the planar dielectric.

However a major shortcoming with the composite PECVD—SOG insulation, is observed during the planarizing etchback process. It has been found that the desired 1:1 etch rate selectivity, between PECVD oxide and SOG, does not exist at the point of etchback where the PECVD becomes exposed. At this point oxygen is released from the PECVD oxide film, severely limiting the amount of polymer formation on the SOG material, in the narrow spaces between metal lines, and thus allowing enhanced etching of the SOG fill. The increased removal rate of SOG fill, in relation to the PECVD oxide on the surface of the narrow metal lines, result in unwanted seams or SOG void formation, thus presenting yield and reliability concerns. Possible solutions for this phenomena has been addressed, as witnessed by Takeshiro, in U.S. Pat. No. 5,316,980. In this patent an etchback apparatus solution is offered, allowing for reduction of PECVD outgassing. Another solution, offered by Kim, et al, in U.S. Pat. No. 5,352,630, uses multiple fill processes to avoid the outgassing and reduced selectivity problem However both solutions referenced above are complex and costly. This invention will teach a process in which the PECVD oxide is prevented from outgassing during the etchback procedure, and thus not adversely influencing the planarization objective of the SOG fill.

SUMMARY OF THE INVENTION

It is an object of this invention to provide a method for filling narrow spaces between metal lines, with a composite dielectric material, resulting in a planarized, voidless fill, at the conclusion of an etchback process.

It is another object of this invention to deposit a composite dielectric of a PECVD silicon oxide underlay, and a PECVD silicon nitride overlay, on the metal wires, prior to the planarizing fill.

It is still another object of this invention to use an organic spin-on-glass, (SOG), as the planarizing material used to fill the narrow spaces between metal lines.

It is yet another object of this invention to use a SF6—Cl2 reactive ion etchback process for planarization.

It is still yet another object of this invention to use a N2O—N2 plasma treatment to remove polymer from the planarized, etchbacked, fill.

In accordance with the present invention a process is described for filling narrow spaces, between metal lines, with a composite dielectric deposition and etchback procedure. A thin layer of PECVD oxide is first deposited on the top and sides of metal lines, as well as in the narrow spaces between metal lines. A second deposition of PECVD nitride is next performed on the underlying PECVD oxide layer. A spin-on-glass, (SOG), is then applied and cured, completely and conformally filling the narrow spaces between metal lines, as well as forming on top of the metal lines. An etchback procedure, using RIE processes, is performed to a point in which the PECVD nitride, overlying the metal line, is exposed. This planar structure, SOG filled vias, and PECVD nitride covered metal lines, is then subjected to a plasma polymer cleanup, followed by deposition of an interlevel PECVD oxide dielectric.

BRIEF DESCRIPTION OF THE DRAWINGS

The object and other advantages of this invention are best described in the preferred embodiment with reference to the attached drawings that include:

FIG. 1, which schematically illustrates a silicon device, with narrow metal lines and spaces, prior to the insulation and planarization process.

FIGS. 2–3, which schematically describe prior art attempts at planarization of the insulator fill.

FIGS. 4–6, schematically illustrating the optimized planarization process described in this invention.

DESCRIPTION OF THE PREFERRED EMBODIMENTS

Figure 5:
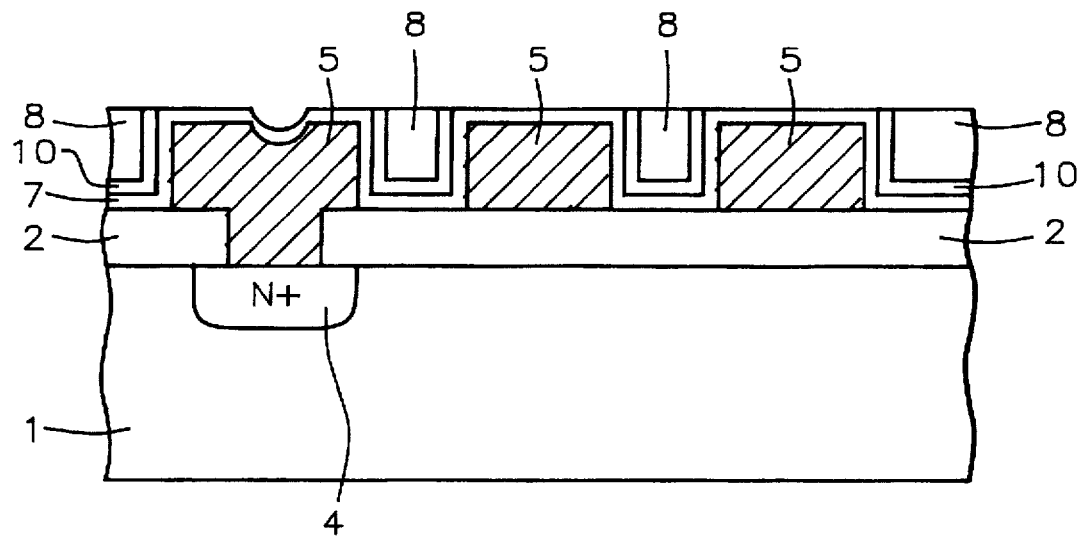

The method for filling narrow spaces with spin-on glass, and successfully etching back the fill, to obtain a planarized structure, will now be covered in detail. This fill and planarization process can used to fabricate MOSFET devices now being manufactured in industry, therefore only the specific areas unique to understanding this invention will be covered in detail.

FIG. 1 depicts a simplified silicon device structure that will ultimately experience the optimized fill and partial etchback processes described in this invention. Briefly a silicon substrate, 1, consisting of P type, single crystal silicon with a <100> orientation, is used. A thick silicon dioxide layer, 2, is thermally grown at a temperature between 850° to 1000° C., to a thickness between about 4000 to 5000 Angstroms. Standard photolithographic and reactive ion etching, (RIE), procedures are employed to open contact hole, 3. An ion implantation procedure, using arsenic or phosphorous is used at an energy between about 50 to 100 Kev., at a dose between 1E14 to 1E16 atoms/cm2, to create active device region, 4. After photoresist removal, followed by careful wet chemical cleans, a deposition of Al—Cu—Si is performed using r.f. sputtering techniques, to a thickness between about 6000 to 8000 Angstroms. Again standard photolithographic and RIE procedures, using a chlorine chemistry, are used to create metal structure, 5. It can be seen that the narrow spacings, 6, between metal lines, between about 0.4 to 0.6 µM, together with the height of metal structures, create an aspect ratio that can be difficult to fill and planarize with conventional insulator deposition and etchback procedures.

FIGS. 2–3, will describe prior art, and the attempts at arriving at planarized insulator fills. First an oxide insulator, 7, obtained from PECVD deposition, using either silane and oxygen, or tetraethylorthosilicate as a source, is deposited at a temperature between about 390° to 410° C., to a thickness between about 1000 to 3000 Angstroms, with 2000 Angstroms being preferred. Next a SOG procedure, using a methyl siloxane, is applied to the structure, followed by curing at a temperature between about 400° to 450° C. The thickness of the SOG layer, 8, on the metal structure, 5, is between 2000 to 6000 Angstroms, and completely fills space, 6, shown in FIG. 2. A blanket partial etchback process is next performed to remove excess SOG, to a point where oxide layer, 7, on metal structure, 5, is exposed. The etchback is performed with RIE processing using CF4 and CHF3. As the etching proceeds a polymer is formed and deposits on the surface of the SOG. However at the point of the etchback process where the SOG is removed from the metal structure, 5, exposing the underlying PECVD oxide, 7, oxygen is released from the PECVD oxide layer. The release of oxygen results in the removal of the polymer from the SOG surface, resulting in enhanced etching of SOG, in space 6. This phenomena leads to void formation, or overetching of SOG in the narrow spaces. This is shown as area 9, in FIG. 3. This inadequate etchback process, resulting in non-planar surfaces, makes it difficult for subsequent upper level metallizations to be patterned, sometimes leading to either yield or reliability problems.

Figure 6:
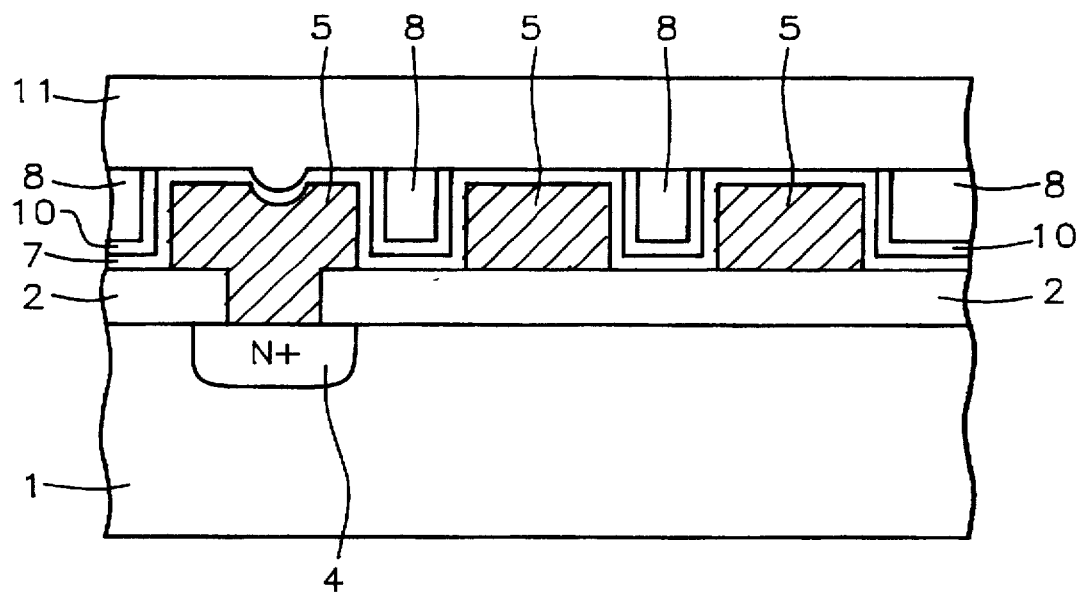

A process described using FIGS. 4–6, will show an optimized process resulting in planar structures, and non-voided SOG fills. Again as previously shown a PECVD oxide, 7, is deposited on metal structure, 5, using identical conditions, however for this case using a film thickness between about 500 to 1500 Angstroms. However in this case a PECVD silicon nitride layer, 10, is deposited on the underlying PECVD oxide layer, 7. The nitride film was grown using SiH4 and NH3, in a N2 ambient, at a temperature between about 390 to 410 C., to a thickness betwen about 1500 to 2500 Angstroms, with 2000 Angstroms being preferred. The hydrogen content in the PECVD nitride film is between about 10 to 15%, to avoid reliability concerns. The process continues with the application and curing of SOG layer, 8, shown schematically in FIG. 4.

FIG. 5 shows the result of a partial etchback of the SOG, using a SF6 and Cl2, RIE process. The partial etchback proceeds to the point in which the PECVD nitride layer, 10, appears on the metal structure, 5. Since the underlying PECVD oxide layer, 7, is protected by the overlying nitride film, deleterious oxygen will not be released, thus avoiding polymer degradation and allowing more SOG to be removed without risking void formation or overetching. Next the remaining PECVD nitride layer, 10, on the metal structure is removed from the underlying oxide layer, 7, via use of a RIE procedure using CHF3 and CF4. Finally a plasma treatment, in a N2O—N2 ambient, removes any residual polymer and results in the planar structure shown in FIG. 5, successfully created by avoiding the release of oxygen from exposed PECVD oxide, during the SOG partial etchback procedure.

Figure 7:
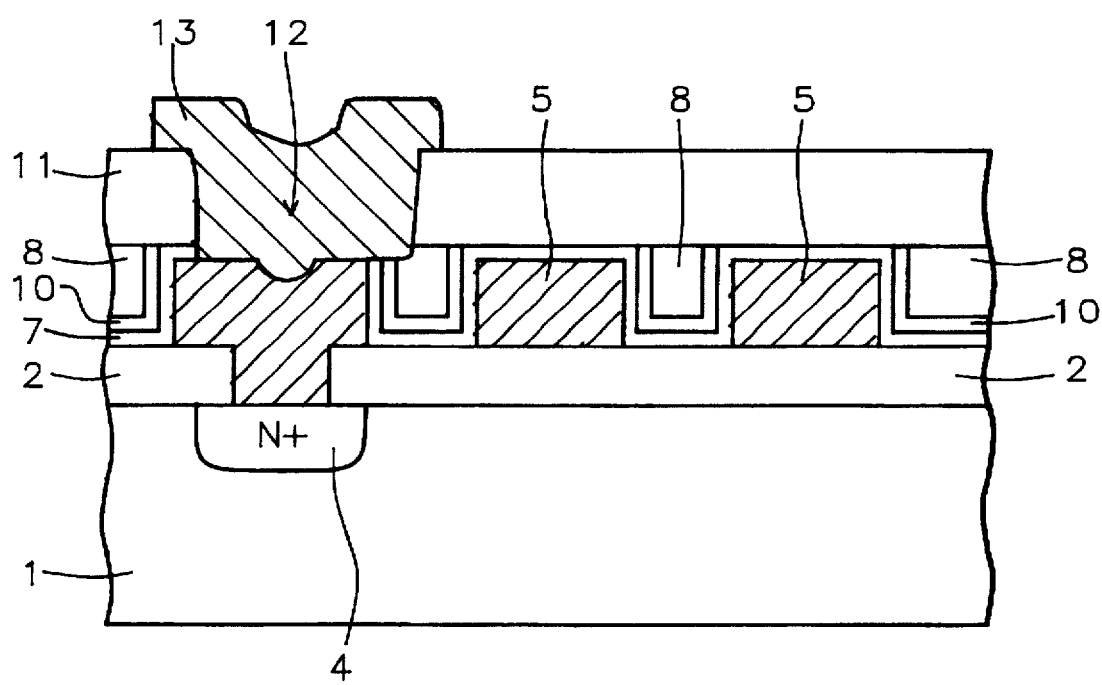
FIG. 7, schematically showing an additional metal level, patterned on the underlying planarized structure.

Subsequent metal levels can now be easily created on this planar structure. For example another layer of PECVD oxide, 11, is grown at a temperature between about 390° to 410° C., to a thickness between about 4000 to 15000 Angstroms. This is shown in FIG. 6. Conventional photolithographic and RIE procedures, using CHF3 as an etchant, are next used to create via hole, 12. After photoresist removal and careful wet chemical cleans, metal deposition of Al—Cu is performed using r.f. sputtering, to a thickness between about 6000 to 8000 Angstroms. Again standard photolithographic and RIE processing, using a chlorine etchant, is used to form upper metal level, 13. The final structure, after photoresist removal and wet chemical cleans, is shown schematically in FIG. 7.

This process, a optimized planarization method for SOG filled vias, can be applied to N type, (NFET), P type, (PFET), devices, as well as to complimentary, (CMOS), structures. In addition BiCMOS, (bipolar—CMOS), devices can also be fabricated using this invention.

While this invention has been particularly shown and described with refernce to, the preferred embodiments thereof, it will be understood by those skilled inthe art that various changes inform and details may be made without departing from the spirit and scope of this invention.

What is claimed is:

1. A method for forming a planarized insulator level on a semiconductor substrate, comprised of a topology of a pattern of raised, conductive structures, and recessed spaces between the raised structures, the method comprising the steps of:

providing the pattern of raised metal lines and spaces on said semiconductor substrate;

depositing a first dielectric layer on said raised metal lines, and in said spaces between said raised metal lines;

depositing a second dielectric layer comprising silicon nitride on said first dielectric layer, on said raised metal lines, and in said space between said raised metal lines;

depositing an insulator fill layer on said second dielectric layer, and completely filling said spaces between said raised metal lines, creating a smooth topology on said semiconductor substrate;

baking said insulator fill layer;

curing said insulator fill layer;

reactive ion etching back said insulator fill layer, to expose a top surface of said second dielectric layer, on said first dielectric layer, overlying said raised metal lines, and to expose the top surface of said insulator fill layer, in said spaces between said raised metal lines;

selectively removing said second dielectric layer from the top surface of said first dielectric layer, in regions overlying said raised metal lines and forming a composite insulator layer, comprised of said second dielectric layer on said first dielectric layer, on the sides of said raised metal lines;

plasma treating an exposed top surface of said first dielectric layer, and the exposed top surface of said insulator fill layer, residing in spaces between said metal lines, in a $N_2O$—$N_2$ ambient; and depositing a third dielectric layer on exposed top surfaces of said first dielectric layer, overlying said raised metal lines, and on said insulator fill, in said spaces between said raised metal lines.

2. The method of claim 1, wherein said raised metal lines are composed of Al—Cu, deposited using r.f. sputtering, to a thickness between about 6000 to 8000 Angstroms.

3. The method of claim 1, wherein said spaces, between said raised metal lines, are between about 0.4 to 0.6 µm, resulting in aspect ratios between about 1.0 to 2.0.

4. The method of claim 1, wherein said first dielectric layer is silicon oxide, deposited using plasma enhanced chemical vapor deposition, (PECVD), at a temperature between about 390° to 410° C., to a thickness between about 500 to 1500 Angstroms.

5. The method of claim 1, wherein said second dielectric layer is silicon nitride, deposited using PECVD, at a temperature between about 390° to 410° C., to a thickness between about 1500 to 2500 Angstroms.

6. The method of claim 1, wherein said insulator fill is a spin on glass, (SOG), deposited using a siloxane source, to a thickness between about 4000 to 6000 Angstroms.

7. The method of claim 1, wherein said insulator fill layer is cured at a temperature between about 410° to 430° C., for between about 40 to 60 min., in an nitrogen ambient.

8. The method of claim 1, wherein etchback of said insulator fill layer is performed using reactive ion etching, (RIE), using between about 4 to 6 sccm of $SF_6$, in chlorine, to obtain an etch rate selectivity of about 1.0 for the insulator fill layer and the second dielectric layers.

9. The method of claim 1, wherein said second dielectric layer is removed using a $CHF_3$—$CF_4$, RIE process.

10. The method of claim 1, wherein said third dielectric layer is silicon oxide, deposited using PECVD, at a temperature between about 390° to 410° C., to a thickness between about 4000 to 6000 Angstroms.

11. A method for forming a planarized insulator level on a semiconductor substrate, comprised of a topology of a pattern of raised, conductive structures, and recessed spaces between the raised structures, the method comprising the steps of:

providing the pattern of raised metal lines and spaces on said semiconductor substrate;

depositing a first silicon oxide layer on said raised metal lines, and in said spaces between said raised metal lines;

depositing a silicon nitride layer on said first silicon oxide layer, on said raised metal lines, and in spaces between said raised metal lines;

depositing a spin on glass on said silicon nitride layer, completely filling said spaces between said raised metal lines creating a smooth topology on said semiconductor substrate;

baking said spin on glass;

curing said spin on glass;

reactive ion etching back said spin on glass to expose the top surface of said silicon nitride layer, on said first silicon oxide layer, overlying said raised metal lines, and to expose a top surface of said spin on glass layer, in said spaces between said raised metal lines;

reactive ion etching, selectively removing said silicon nitride layer, from the top surface of said first silicon oxide layer, exposing said first silicon oxide layer, overlying said raised metal lines, and forming a composite insulator layer comprised of said silicon nitride layer on said first silicon oxide layer, on the sides of said raised metal lines;

plasma treating the exposed top surface of said first silicon oxide layer, overlying said raised metal lines, and plasma treating the exposed top surface of spin on glass, in said spaces between said raised metal lines, using a $N_2O$—$N_2$ ambient; and depositing a second silicon oxide layer on said first silicon oxide layer, overlying said raised metal lines, and on said spin on glass, in said spaces between said raised metal lines.

12. The method of claim 11, wherein said raised metal lines are composed of Al—Cu, deposited using r.f. sputtering, to a thickness between about 6000 to 8000 Angstroms.

13. The method of claim 11, wherein said spaces, between said raised metal lines, is between about 0.4 to 0.6 µm, resulting in aspect ratios between about 1.0 to 2.0.

14. The method of claim 11, wherein said first silicon oxide layer is deposited using PECVD, at a temperature between about 390° to 410° C., to a thickness between about 500 to 1500 Angstroms.

15. The method of claim 11, wherein said silicon nitride layer is deposited using PECVD, at a temperature between about 390° to 410° C., to a thickness between about 1500 to 2500 Angstroms.

16. The method of claim 11, wherein said spin on glass is deposited using a siloxane source, to a thickness between about 4000 to 6000 Angstroms.

17. The method of claim 11, wherein said spin on glass is cured at a temperature between about 410° to 430° C., for a time between about 40 to 60 min., in an nitrogen ambient.

18. The method of claim 11, wherein etchback of said spin on glass is performed using RIE, using between about 4 to 6 sccm of $SF_6$, in chlorine, to obtain a etch rate selectivity of about 1.0 for the SOG and silicon nitride layers.

19. The method of claim 11, wherein said silicon nitride layer is removed using a $CHF_3$—$CF_4$ RIE process.

20. The method of claim 11, wherein said second silicon oxide layer is deposited using PECVD, at a temperature between about 390° to 410° C., to a thickness between about 4000 to 6000 Angstroms.

* * * * *